United States Patent
Spory

(10) Patent No.: US 8,466,371 B2
(45) Date of Patent: Jun. 18, 2013

(54) PRINTED CIRCUIT BOARD INTERCONNECTING STRUCTURE WITH COMPLIANT CANTILEVER INTERPOSERS

(76) Inventor: Erick Spory, Colorado Springs, CO (US)

( * ) Notice: Subject to any disclaimer, the term of this patent is extended or adjusted under 35 U.S.C. 154(b) by 737 days.

(21) Appl. No.: 12/267,864

(22) Filed: Nov. 10, 2008

(65) Prior Publication Data

US 2009/0120678 A1 May 14, 2009

Related U.S. Application Data

(60) Provisional application No. 60/986,947, filed on Nov. 9, 2007.

(51) Int. Cl.
*H05K 1/16* (2006.01)

(52) U.S. Cl.
USPC .......................................... 174/260; 174/254

(58) Field of Classification Search
USPC ................................ 361/760, 749; 324/762.01
See application file for complete search history.

(56) References Cited

U.S. PATENT DOCUMENTS

| | | | | |
|---|---|---|---|---|
| 4,548,451 A * | 10/1985 | Benarr et al. | | 439/85 |
| 5,759,047 A * | 6/1998 | Brodsky et al. | | 439/66 |
| 7,292,055 B2 * | 11/2007 | Egitto et al. | | 324/754.18 |
| 7,503,769 B2 * | 3/2009 | Ohtsuki et al. | | 439/66 |
| 2007/0068700 A1 * | 3/2007 | Ohtsuki et al. | | 174/261 |

* cited by examiner

*Primary Examiner* — Ishwarbhai Patel
(74) *Attorney, Agent, or Firm* — Lathrop & Gage, LLP; Dan Cleveland, Jr.

(57) ABSTRACT

An interconnecting structure for interconnecting two electronic modules. The structure includes a dielectric substrate having a copper trace deposited on the lower surface thereof, and a copper pad disposed on the upper surface of the substrate directly above one end of the trace. A first copper plate-up area deposited on the pad, and a second copper plate-up area is deposited on the distal end of the trace. A slot, semi-circumscribing the pad and extending on both sides of the trace toward the distal end of the trace, is cut through the substrate to allow the proximal end of the trace to be displaced in a cantilevered manner below the lower side of the substrate when a force is applied to the pad.

9 Claims, 6 Drawing Sheets

PRINTED CIRCUIT BOARD INTERCONNECTING STRUCTURE WITH COMPLIANT CANTILEVER INTERPOSERS

RELATED APPLICATIONS

This application claims priority to U.S. Provisional Application Ser. No. 60/986,947 filed Nov. 9, 2007, the disclosure of which is incorporated herein by reference.

SUMMARY

An interconnecting structure for interconnecting two electronic modules is disclosed. The structure includes a dielectric substrate having a copper trace deposited on the lower surface thereof, and a copper pad disposed on the upper surface of the substrate directly above one end of the trace. A first copper plate-up area deposited on the pad, and a second copper plate-up area is deposited on the distal end of the trace. A slot, semi-circumscribing the pad and extending on both sides of the trace toward the distal end of the trace, is cut through the substrate to allow the proximal end of the trace to be displaced in a cantilevered manner below the lower side of the substrate when a force is applied to the pad.

DETAILED DESCRIPTION

A dual-sided printed circuit (PC) board including an interconnecting structure for electrically coupling two electronic modules and a corresponding method for manufacturing the structure is disclosed herein. This interconnecting structure (hereinafter 'interposer') includes a conductive trace, on the PC board substrate, around one end of which a 'U'-shaped slot is cut through the substrate. Under compression, such as when compressed by an above device under test and a test board below, or during electrical mating of two circuit boards, this U-shaped slot allows the interposer to be displaced to form a cantilevered structure.

This cantilevered structure provides for mating compliance such that the interposers can accommodate slight pad or board height variations (2×~0.004±0.001 in.) while still making electrical continuity, thereby eliminating the need for an underlying conductive elastomer on the PC board. Elastomers do not perform well at high temperatures (above 85 C), thus, in an exemplary embodiment, the PC board substrate is fabricated from a flexible dielectric material such as Kapton® polyimide film manufactured by DuPont. The present interposers may be fabricated from certain polyimides and other materials that can provide satisfactory high-temperature performance at up to 150 C with peak operation at 200 C.

Figure 1A:
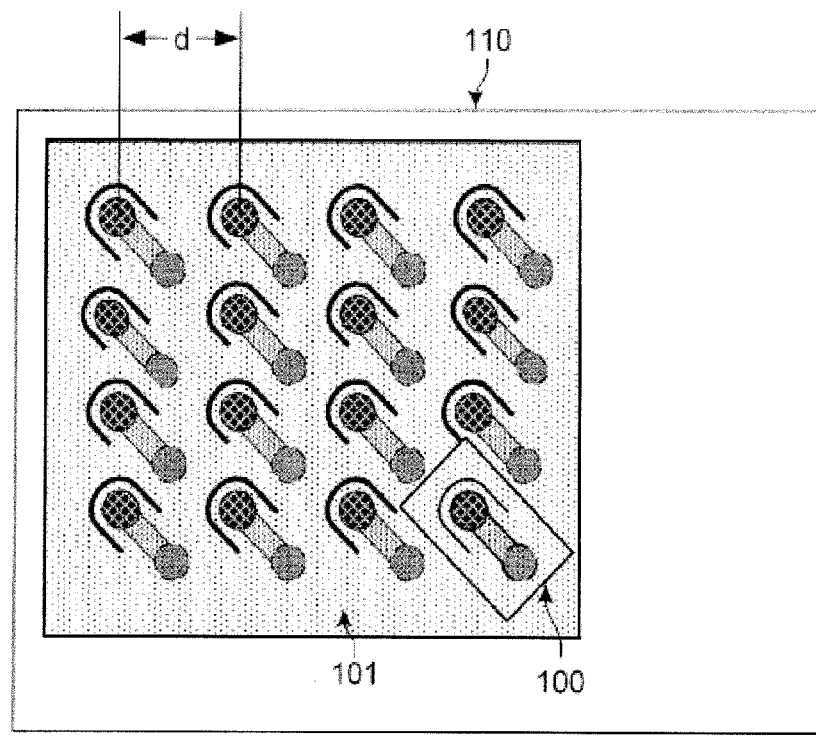
FIG. 1A is an exemplary diagram showing a partial top view of a printed circuit board including a plurality of interposers.

FIG. 1A is an exemplary diagram showing a top view of part of a printed circuit board 110 including a plurality of interposers 100 located on the PC board substrate 101. The configuration of interposers 100 shown in FIG. 1A is amenable for use with a ball grid array (BGA), land grid array (LGA), QFN (Quad Flat package No leads), and any other leadless chip packages for testing. Most of the latest generation CPUs from Intel/AMD employ LGA packages. In one embodiment, when, for example, a plurality of interposers 100 are employed with a BGA, the distance 'd' between adjacent interposer pads is approximately 0.032 inches, or 0.8 mm.

Figure 1B:
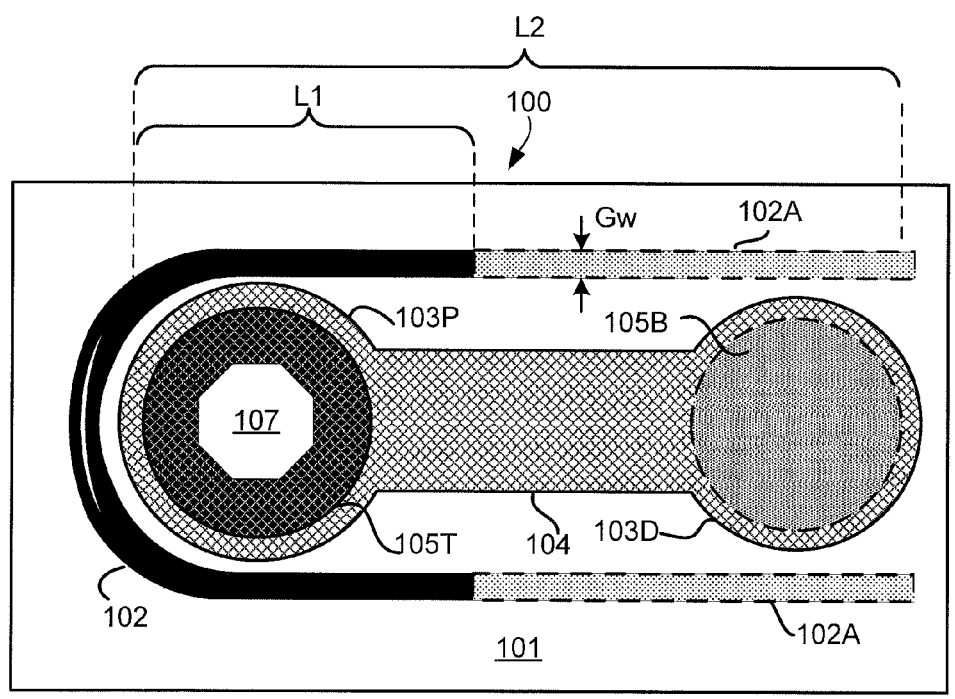
FIG. 1B is an exemplary diagram showing a top view of one of the interposers of FIG. 1A.

FIG. 1B is an exemplary diagram showing a top view of one of the interposers of FIG. 1A. In an exemplary embodiment, a 3-D process is used to manufacture a printed circuit board 110 which includes a plurality of interposers 100 located on a substrate 101 comprising a Kapton® film approximately 0.002" to 0.003" thick. This substrate may be made from other flexible dielectric materials, such as other types of polyimide film, or FR-4 (IPC 4101/21), which can be manufactured sufficiently thin to accommodate a desired amount of flexure and which can allow for adherence of a conductive copper trace.

Figure 2:
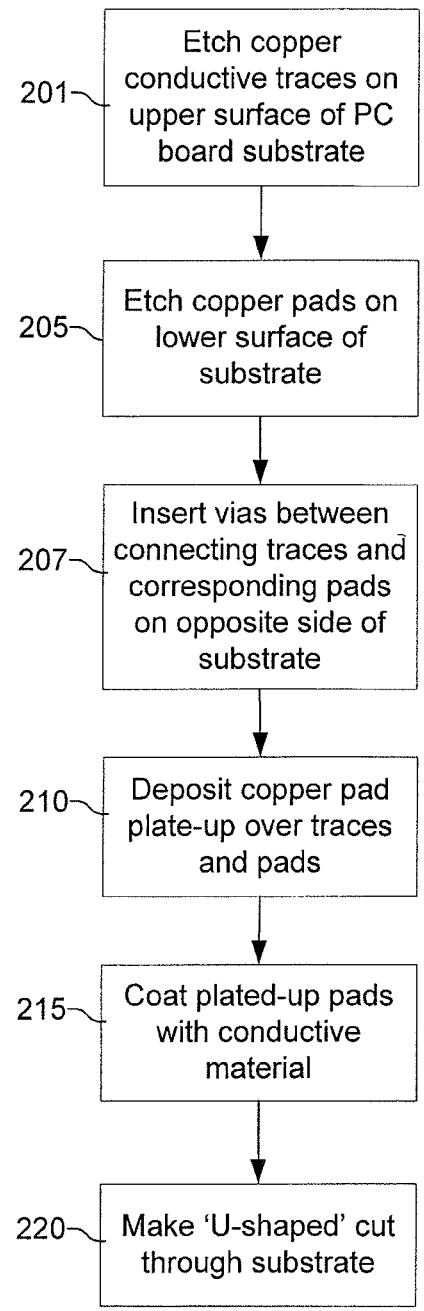
FIG. 2 is a flowchart showing an exemplary process for manufacturing a printed circuit board in accordance with the present method.
Figure 3A:
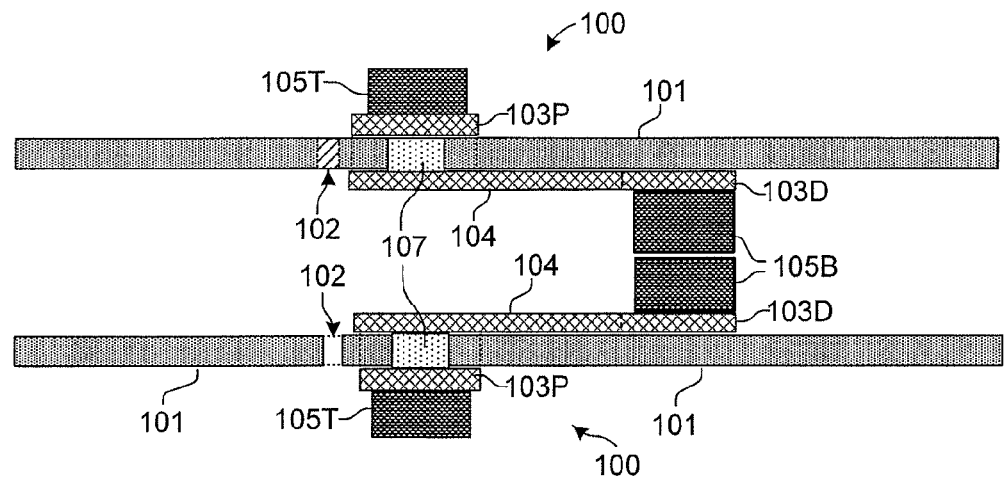
FIG. 3A is an exemplary diagram showing a side view of two printed circuit boards, each having an offset cantilever in a non-compressed condition.
Figure 3B:
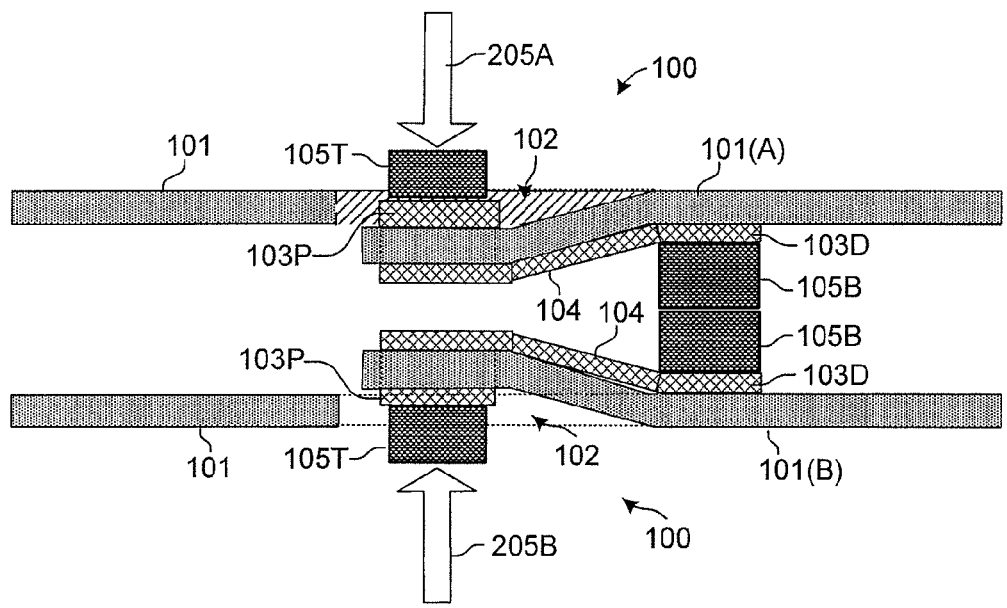
FIG. 3B is an exemplary diagram showing the circuit boards of FIG. 1A with the cantilevers in a compressed condition.

FIG. 2 is a flowchart showing an exemplary process for manufacturing a printed circuit board in accordance with the present method. FIG. 3A is an exemplary diagram showing a side view of two printed circuit boards, each having a potential cantilever or lever arm in a non-compressed condition, and FIG. 3B is an exemplary diagram showing the circuit boards of FIG. 1A with the cantilevers in a compressed condition. An understanding of the present process and operation of the interposers manufactured thereby is facilitated by reference to these drawings (and also to FIG. 1B) in conjunction with one another.

In accordance with the present method, as shown in FIG. 2, copper conductive traces 104 are initially etched on the upper surface of a copper-clad printed circuit board substrate 101, at step 201. Typically, a substrate 101 has a standard thickness (approximately 0.00075 inch to 0.0015 inch) of copper plated to the outside surfaces of the board substrate 101.

At step 205, copper pads 103 are etched on the lower surface of the substrate 101. In steps 201 and 205, the copper on each PC board 110 is selectively removed by etching those areas where the copper is not required. In the present case, lever arm trace areas 104 on one side of substrate 101 and pad bases 103P on the other side of the substrate are the only regions where the copper is not etched off of the substrate. Lever arm trace areas 104 and the underlying substrate form cantilevers when a suitable force is applied, as described below.

For small trace widths, the traces 104 may be deposited directly on the film, thus omitting the etching step. The traces (and corresponding lever arms) may be varied in both width and depth to adjust a desired flex vs. downward compression ratio. In addition, the use of thinner substrates (approximately 0.001 inch in thickness and below) allows very low compression interposers to be fabricated. Depending on overall planarity of the mating part (the connecting entity) and the PC board (or board-to-board planarity), extremely low compressive force requirements and reduction of undesirable modulation of the substrate may be achieved by the use of relatively thinner substrates.

At step 207, vias 107 connecting the traces 104 and corresponding pads 103P on the opposite side of substrate 101 may be placed through the substrate.

Next, at step 210, an approximately 0.004 inch thick (plus or minus approximately 0.001") copper pad plate-up (i.e., trace build-up) 105 is applied over pad bases 103P and trace areas 103D. For clarity, plate-ups 105 on the top and bottom of substrate 101 are respectively designated as plate-ups 105T and 105B. This selective plate-up forms a lever arm of length L1 or L2 (shown in FIG. 1B), depending on the length of U-shaped slot 102/102A (described in detail below), which provides the potential for compressive displacement and vertical lever arm travel orthogonal to the plane of substrate 101. Pad plate-up areas 105T/105B provide additional pad height to allow continued contact with a connecting entity (e.g., a ball grid array) when the entity has been connected to a pad and part of the pad is depressed below the upper surface of substrate 101.

In an exemplary embodiment, at step 215, all external surfaces of the plated-up pads 105T/105B are then coated with conductive (e.g., diamond) material for electrical continuity under compression. A conductive plating process, such as that described in U.S. Pat. No. 6,630,203, is used to coat the pads. This process includes an electroless co-deposition of metal and hard particles on an electrical contact surface which enhances the thermal and electrical conductivity between the contact surfaces and their corresponding substrate areas.

At step 220, a 'U'-shaped slot 102 (hereinafter referred to as a 'U-cut' } of approximately 0.002 inch, plus or minus approximately 0.001 inch (as indicated by 'Gw' in FIG. 1B), is then cut through the Kapton (or other material) substrate, preferably using a laser.

As can be seen from FIG. 1B, in an exemplary embodiment, U-cut 102 has the approximate shape of a semicircle with a pair of parallel lines extending tangentially, in the same direction, from opposite ends of the semicircle. In one embodiment, U-cut 102 is made in an area semi-circumscribing proximal pad 103P, with extended ends providing a length which is at least greater than the diameter Pd of pad 103P. U-cut 102 may thus have an effective length of approximately between 1.5 Pd-2 Pd, and a width slightly greater than pad diameter Pd. In an exemplary embodiment, the distance between the inner edge of U-cut 102 and the outer edge of pad 103P is approximately 0.001 inches, although this distance may be smaller or larger, as a function of substrate thickness, rigidity, and other factors.

The length of U-cut 102 is not critical as long as the cut provides a lever arm of sufficient length to accommodate a desired amount of substrate/trace flexure. The cut should preferably extend past the pad, approximately half the distance of the lever arm. The ends of U-cut 102 may be parallel, as indicated in FIG. 1B, or, for minimum pitch arrangements with a relatively large density of interposers on a given substrate, the ends of U-cut 102 may taper inward toward trace 104 in a 'horseshoe' pattern. As can be seen from FIG. 3B, U-cut 102 allows opposing pads 103 to flex, by providing compliance between adjacent pads. This laser cutting of the substrate 101 provides for better flexibility and compliance than that attainable by conventional cantilevered interposers.

As shown in FIG. 1B, the U-cuts 102 may continue past the closest associated pad 103P toward (and past) the distal associated pad 103D, as indicated by cut continuation 102A, which provides a lever arm of length L2. The length of the U-cut 102 is essentially limited only by the spacing of interposers 100 on substrate 101, i.e., limited by the location of an interposer's next nearest pad/cut neighbor.

As shown in FIG. 3B, when a mating force is applied to plate-ups 105T on respective substrates 101(A) and 101(B) via connecting entities 205(A) and 205(B), as shown by the corresponding arrows, lever arm trace areas 104 on respective underlying substrates 101(A) and 101(B) are displaced toward each other in a cantilevered fashion. The combination of this cantilevered structure together with pad plate-up area 105 allows for vertical lever arm travel sufficient to allow interposers 100 to provide electrical continuity between two connecting entities while accommodating variations in pad and board height.

Figure 4:
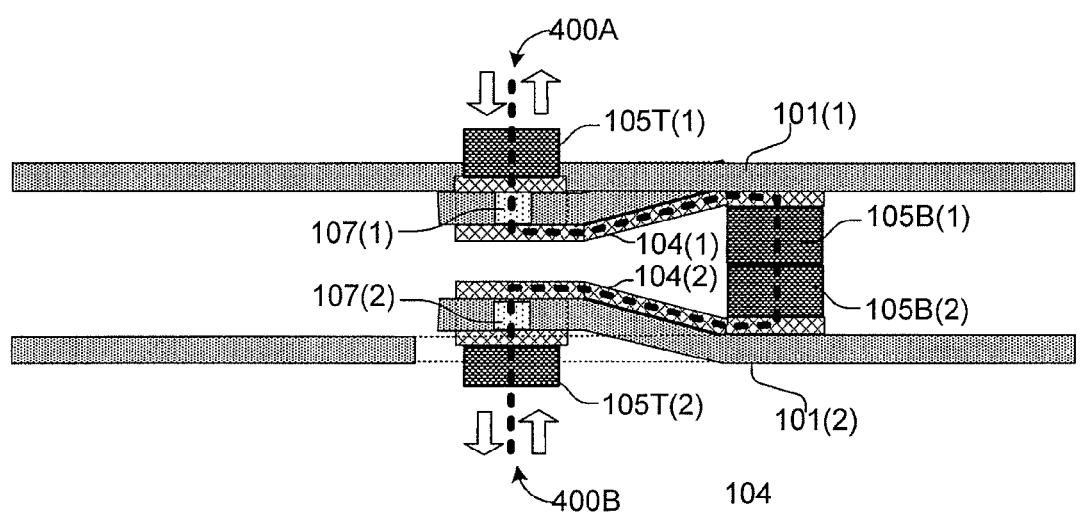
FIG. 4 is an exemplary diagram showing current flow through an interposer.

FIG. 4 is a diagram showing current flow through an exemplary interposer 100. As shown in FIG. 4, when interposers on substrates 101(1) and 101(2) are in a compressed condition, the electrical current path between a first connecting entity (e.g., a ball grid array) and a second connecting entity (e.g., a circuit under test) is indicated by the dashed line 400A/400B between the top-most plate-up 105T(1) and the bottom-most plate-up 105T(2). Electrical continuity through path 400A/400B is established through plate-up 105T(1), via 107(1), trace 104(1), plate-up 105B(1), plate-up 105B(2), trace 104(2), via 107(2), and plate-up 105T(2).

Figure 5:
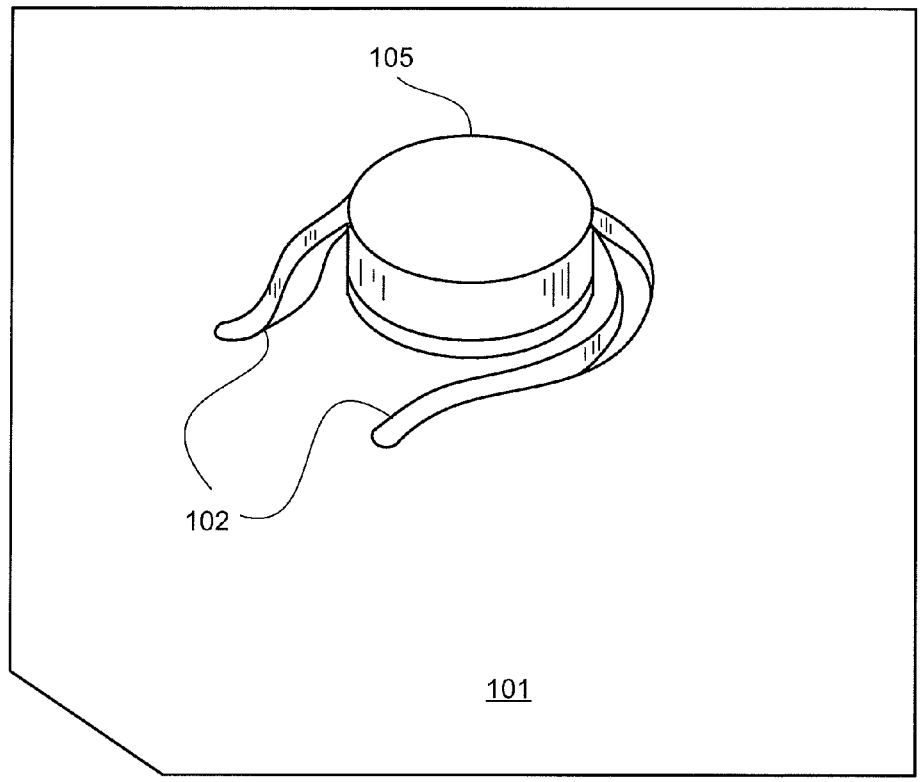
FIG. 5 is an exemplary perspective view of the interposer of FIGS. 1A, 1B, 3A and 3B, showing the U-cut.
Figure 6:
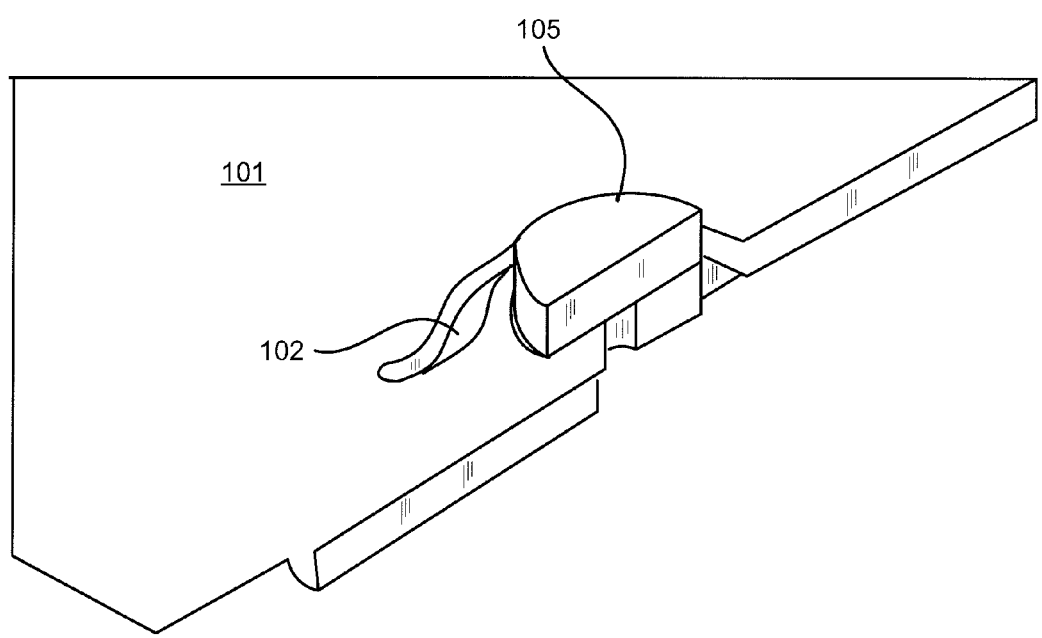
FIG. 6 is an exemplary diagram showing a cutaway view of the interposer of FIG. 5.

FIG. 5 is an exemplary perspective view of the interposer of FIGS. 1 and 3A/3B, showing U-cut 102 around plate-up pad 105, and FIG. 6 is an exemplary cutaway view of the interposer of FIG. 5. As shown in FIGS. 5 and 6, U-cut 102 has a 'horseshoe' shape, which is employed to provide increased flexibility of lever arm trace areas 104 when the length of slot 102 must be made relatively short to provide sufficient slot-to-slot spacing between multiple interposers 100. A horseshoe-shaped slot 102 thus allows closer interposer spacing when there is a high density of interposers 100 on a single substrate 101.

Figure 7:
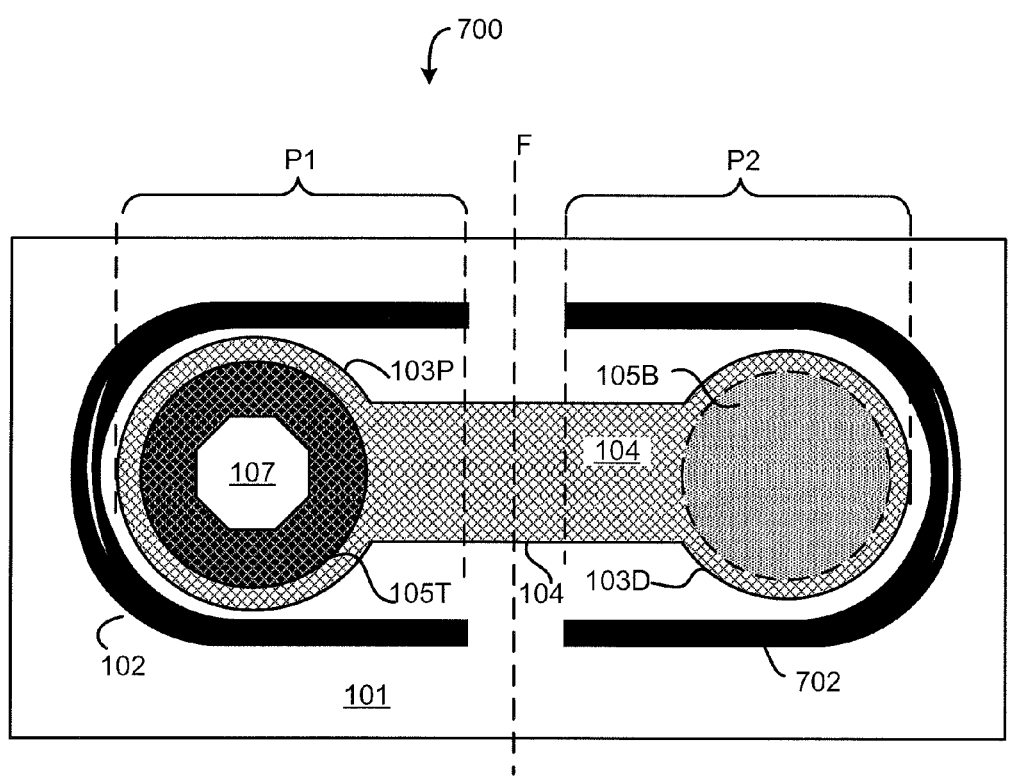
FIG. 7 is an exemplary diagram showing a configuration in which an interposer includes two U-cuts.

For large-pitched (low board density) designs, a further embodiment of the present interposer includes U-shaped cuts made through a substrate 101 on both sides of an associated pair of pads 103P/103D. FIG. 7 is an exemplary diagram showing a configuration in which an interposer 700 employs two U-shaped slots 102 and 702. As shown in FIG. 7, each resultant lever arm, indicated by lever trace arm portions P1 and P2, flexes downward (through substrate 101) about line F, on the remaining Kapton area bridging the two sides of the interposer 700.

Interposer technology similar to that described above may also be employed with a single circuit board by installing a single or dual interposer set 100/700 on the circuit board substrate 101, while applying compressive force to electrically mate the interposer with the connecting entity.

Certain changes may be made in the above methods and systems without departing from the scope of that which is described herein. It is to be noted that all matter contained in the above description or shown in the accompanying drawings is to be interpreted as illustrative and not in a limiting sense. For example, the interposers shown in the drawings may include different components than those shown therein. The elements and steps shown in the present drawings may be modified in accordance with the methods described herein, and the steps shown therein may be sequenced in other configurations without departing from the spirit of the system thus described. The following claims are intended to cover all generic and specific features described herein, as well as all statements of the scope of the present method, system and structure, which, as a matter of language, might be said to fall there between.

What is claimed is:

1. An electronic module-to-module interconnecting structure comprising:
   a first module and a second module, each having
   a dielectric substrate having an first surface and a second surface;
   a copper trace deposited on the second surface of the substrate, the copper trace having proximal and distal ends;
   a copper pad, disposed on the first surface of the substrate directly upon the proximal end of the trace;
   a first copper plate-up area deposited on the pad;
   a second copper plate-up area deposited on the distal end of the trace;
   a slot passing through the substrate, wherein the middle of the slot is disposed in closely-spaced proximity to the distal end of the trace to form a lever arm, and wherein the slot semi-circumscribes the pad and extends on both sides of the trace toward the distal end of the trace; and
   means for placing the copper pad in electric communication with the copper trace;
   the first module and the second module being placed in an orientation such that opposing forces placed upon each lever arm at the distal end results in opposing deflections of the respective lever arms towards one another in cantilever fashion to drive the first copper plate-up area on the proximate end of the lever arm of the of the first module into electrical contact with the first copper plate up area on the proximate end of the second module.

2. The interconnecting structure of claim 1, wherein the slot is of a relatively uniform width between approximately 0.001 inches and 0.003 inches.

3. The interconnecting structure of claim 1, wherein the substrate is made from the group of materials consisting of polyamide film and FR-4 material.

4. The interconnecting structure of claim 1, wherein each of the copper plate-up areas has a thickness of between approximately 0.003 inches and 0.005 inches.

5. The interconnecting structure of claim 1, wherein the distance between the inner edge of the slot and the outer edge of the pad is at least approximately 0.001 inch.

6. The interconnecting structure of claim 1, wherein the slot extends a distance of at least half the length of the trace.

7. The interconnecting structure of claim 1, wherein:
   the proximal end of the trace is displaced in a cantilevered manner below the lower side of the substrate when a force is applied proximate to and orthogonal to the pad,
   the first plate-up area contacts a first connecting entity, and the second plate-up area contacts a second connecting entity to establish electrical continuity therebetween, via the first plate-up area, the trace, and the second plate-up area.

8. The interconnecting structure of claim 7, wherein the second connecting entity is a second interconnecting structure substantially identical to the interconnecting structure of claim 1, co-disposed in a mirror-image spatial relationship.

9. A plurality of the interconnecting structures of claim 1, disposed on a single said substrate.

* * * * *